(12) United States Patent
Chen (10) Patent No.: US 7,838,975 B2
(45) Date of Patent: Nov. 23, 2010

(54) FLIP-CHIP PACKAGE WITH FAN-OUT WLCSP

(75) Inventor: Nan-Cheng Chen, Hsin-Chu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/370,537

(22) Filed: Feb. 12, 2009

(65) Prior Publication Data

US 2009/0294938 A1    Dec. 3, 2009

Related U.S. Application Data

(60) Provisional application No. 61/056,401, filed on May 27, 2008.

(51) Int. Cl.
H01L 23/52 (2006.01)
(52) U.S. Cl. ............ 257/676; 257/778; 257/E23.141
(58) Field of Classification Search ........... 257/676, 257/692, 778, E23.141, E23.06
See application file for complete search history.

(56) References Cited

U.S. PATENT DOCUMENTS

| | | | |
|---|---|---|---|
| 6,294,407 B1 * | 9/2001 | Jacobs | 438/118 |
| 7,074,649 B2 | 7/2006 | Hedler et al. | |
| 7,189,593 B2 | 3/2007 | Lee | |
| 7,288,835 B2 | 10/2007 | Yim | |
| 7,354,800 B2 | 4/2008 | Carson | |
| 7,372,141 B2 | 5/2008 | Karnezos | |
| 7,489,041 B2 | 2/2009 | Akram | |
| 7,566,966 B2 | 7/2009 | Chow | |

OTHER PUBLICATIONS

Tung-Hsien Hsieh, Title: Multi-Chip Package, pending U.S. Appl. No. 12/704,517, filed Feb. 11, 2010.
Tung-Hsien Hsieh et al., Title: Wire Bond Chip Package, pending U.S. Appl. No. 12/485,923, filed Jun. 17, 2009.

* cited by examiner

Primary Examiner—Roy K Potter
(74) Attorney, Agent, or Firm—Winston Hsu; Scott Margo (57) ABSTRACT

A flip-chip package includes a package carrier; a semiconductor die having a die face and a die edge, the semiconductor die being assembled face-down to a chip side of the package carrier, and contact pads are situated on the die face; a rewiring laminate structure between the semiconductor die and the package carrier, the rewiring laminate structure including a re-routed metal layer, and at least a portion of the re-routed metal layer projects beyond the die edge; and bumps arranged on the rewiring laminate structure for electrically connecting the semiconductor die with the package carrier.

52 Claims, 12 Drawing Sheets

FIG. 12

FLIP-CHIP PACKAGE WITH FAN-OUT WLCSP

CROSS REFERENCE TO RELATED APPLICATIONS

This application claims the benefit of U.S. provisional application No. 61/056,401 filed May 27, 2008.

BACKGROUND OF THE INVENTION

1. Field of the Invention

The present invention relates generally to semiconductor packaging and, more particularly, to a flip-chip package for high-pin-count applications.

2. Description of the Prior Art

As known in the art, there are a variety of chip package techniques such as ball grid array (BGA), wire bonding, flip-chip, etc. for mounting a die on a substrate via the bonding points on both the die and the substrate. In order to ensure miniaturization and multi-functionality of electronic products or communication devices, semiconductor packages are required to be of small in size, multi-pin connection, high speed, and high functionality.

Increased Input-Output (I/O) pin count combined with increased demands for high performance ICs has led to the development of Flip-Chip Packages. Flip-chip technique uses bumps on bonding pads on chip to interconnect directly to the package medium. The chip is bonded face down to the package medium through the shortest path. The technique can be applied not only to single-chip packaging, but also to higher or integrated levels of packaging in which the packages are larger and to more sophisticated substrates that accommodate several chips to form larger functional units. The flip-chip technique, using an area array, has the advantage of achieving the highest density of interconnection to the device and a very low inductance interconnection to the package.

Figure 1:
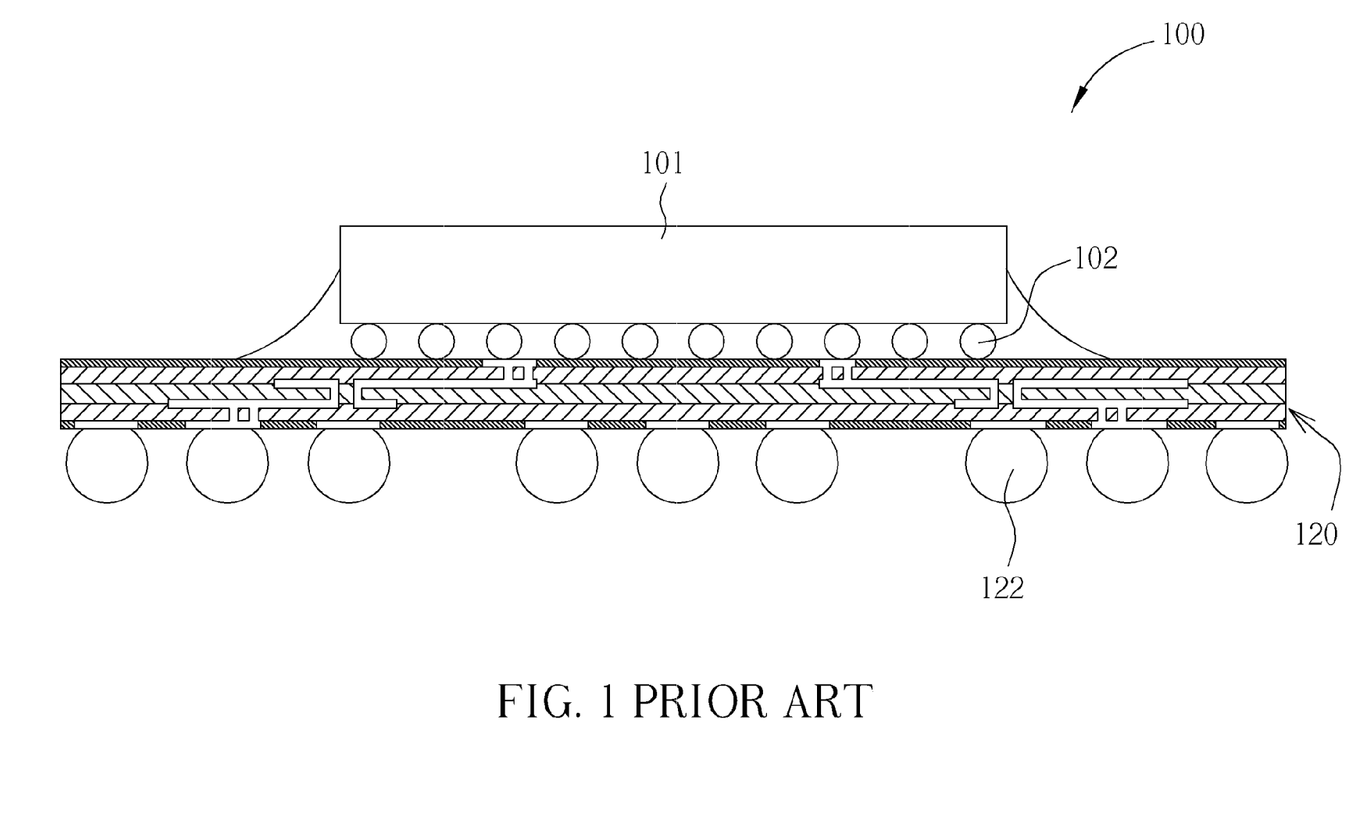
FIG. 1 is a schematic, cross-sectional diagram illustrating a conventional flip-chip CSP package.

FIG. 1 is a schematic, cross-sectional diagram illustrating a conventional flip-chip chip scale package (FCCSP). As shown in FIG. 1, the FCCSP 100 comprises a die 101 mounted face-down on a top surface of the carrier 120 and is connected to the carrier 120 through solder bumps 102. A plurality of solder balls 122 are provided on a bottom surface of the carrier 120 for the connection with a circuit board. This package construction typically utilizes eutectic tin/lead flip-chip interconnect technique, in either area array or peripheral bump layout, replacing standard wire-bond interconnect. The elimination of wire-bond loops allows for a low inductance connection to the die, while the increased routing density enables optimized electrical paths for critical high frequency signal lines.

Figure 2:
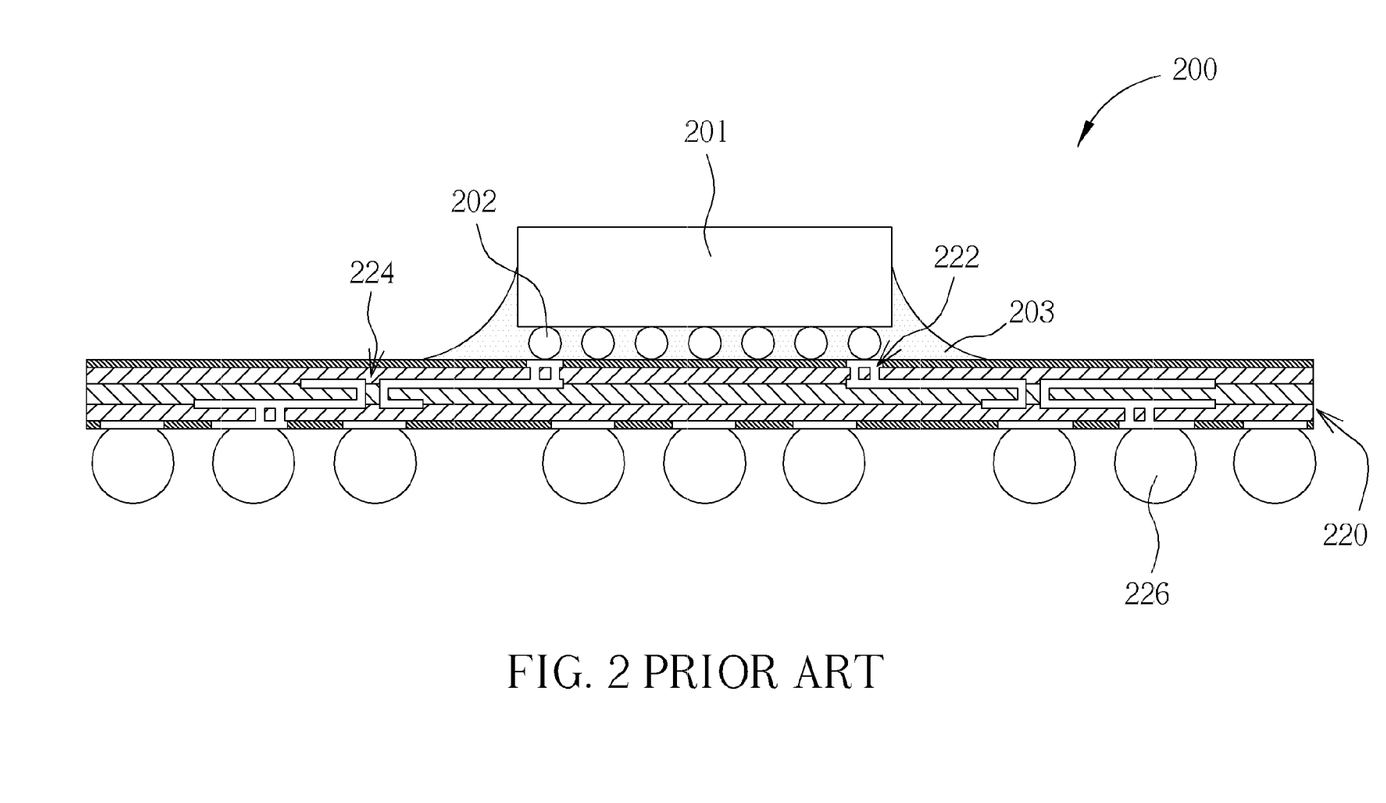
FIG. 2 is a schematic, cross-sectional diagram illustrating a conventional flip-chip BGA package.

FIG. 2 is a schematic, cross-sectional diagram illustrating a conventional flip-chip ball grid array (FCBGA) package. As shown in FIG. 2, the FCBGA package 200 comprises a die 201 mounted face down on a top surface of a chip carrier substrate 220 and is connected to the chip carrier substrate 220 through the solder bumps 202. An underfill 203 fills the gap between the die 201 and the top surface of the chip carrier substrate 220. The chip carrier substrate 220 may comprise multi-layer traces, and different layers of traces are interconnected together through blind via 222 or buried via 224. For example, the blind via 222 may be drilled by laser for achieving a higher density. A plurality of solder balls 226 are provided on a bottom surface of the chip carrier substrate 220. The FCBGA package 200 allows for the design of advanced packaging solutions that are ideal for current and future high-speed networking and digital TV systems. For example, to maintain signal integrity, this package features low inductance, low dielectric loss and impedance matching.

However, the conventional flip-chip technique is facing the challenge of bump pitch limitation on the substrate. Besides, a high-performance FCBGA package is costly due to the expensive chip carrier substrate that typically comprises 1+2+1 or more-ayer build up. The bottleneck of the flip-chip roadmap is the bump pitch of the substrate since the development and shrinkage of the bump pitch is much slower than the die shrinking and the increase of the pin count. Even the die shrinking will exceed the shrinkage of bump pitch resolution on substrate carrier in the future. To conquer the issue of such technology gap, Silicon interposer and TSV (Through Silicon Via) technology are the only and very expensive solution. Therefore, there is a strong need in this industry to provide an improved flip-chip package that is cost-effective and can overcome the bump pitch limitation on the substrate.

SUMMARY OF THE INVENTION

It is one object of this invention to provide a flip-chip package for high-pin-count applications, which is cost-effective and can overcome the bump pitch limitation on the substrate.

According to the embodiments, a flip-chip package includes a package carrier; a semiconductor die having a die face and a die edge, the semiconductor die being assembled face-down to a chip side of the package carrier, wherein a plurality of contact pads are situated on the die face; a rewiring laminate structure between the semiconductor die and the package carrier, the rewiring laminate structure comprising a re-routed metal layer, wherein at least a portion of the re-routed metal layer projects beyond the die edge; and a plurality of bumps arranged on the rewiring laminate structure for electrically connecting the semiconductor die with the package carrier.

In one aspect, a semiconductor chip package includes a semiconductor die having thereon a plurality of contact pads on its die face; a mold cap encapsulating a portion of the semiconductor die; a redistribution layer covering the die face and a portion of the mold cap for redistributing, wherein the redistribution layer fans out the contact pads; a plurality of bumps on the redistribution layer; a substrate with two metal wiring layers disposed on a chip side and on an opposite side respectively, wherein the plurality of bumps are mounted on the chip side; and a plurality of solder balls on the opposite side of the substrate.

In another aspect, a semiconductor chip package includes a package carrier having a chip side and on an opposite side; a fan-out wafer level device mounted on the chip side of the package carrier; and an underfill between the package carrier and the fan-out wafer level device.

In still another aspect, a semiconductor chip package includes: a semiconductor die having thereon a plurality of contact pads on its die face; a mold cap encapsulating a portion of the semiconductor die; a redistribution layer covering the die face and a portion of the mold cap for redistributing, wherein the redistribution layer fans out the contact pads; a plurality of bumps on the redistribution layer; and a leadframe, wherein the semiconductor die is mounted on the leadframe.

In still another aspect, a semiconductor chip package includes: a package carrier having a chip side and an opposite side; a fan-out wafer level device mounted on the chip side of the package carrier; and a molding compound encapsulating the fan-out wafer level device and the molding compound also filling into a gap between the package carrier and the fan-out wafer level device.

The present invention takes advantage of the WLCSP technology and fans out small-pitch I/O pins or bumps of a chip such that the fan-out pads meet the minimum bump pitch requirement of the laggard flip-chip process. A package carrier is used to mechanically support the fan-out rewiring laminate structure having a number of fan-out bond pads that exceeds, for example, 300 or more.

These and other objectives of the present invention will no doubt become obvious to those of ordinary skill in the art after reading the following detailed description of the preferred embodiment that is illustrated in the various figures and drawings.

DETAILED DESCRIPTION

The present invention pertains to a flip-chip package for high-pin-count applications, which may involve the use of wafer-level packaging (WLP) technique. Wafer-level packaging (WLP) refers to the technique of packaging an integrated circuit at wafer level, instead of the traditional process of assembling the package of each individual unit after wafer dicing. WLP is essentially a true chip-scale packaging (CSP) technique, since the resulting package is practically of the same size as the die. Furthermore, wafer-level packaging paves the way for true integration of wafer fabrication, packaging, test, and burn-in at wafer level, for the ultimate streamlining of the manufacturing process undergone by a device from silicon start to customer shipment.

The present invention takes advantage of the WLCSP technology and fans out small pitch I/O pins or bumps on a chip such that the fan-out bond pads meet the minimum bump pitch requirement (150 nm) of current flip-chip process. A package carrier is used to mechanically support the fan-out rewiring laminate structure having a number of fan-out bond pads that exceeds 300.

Figure 3:
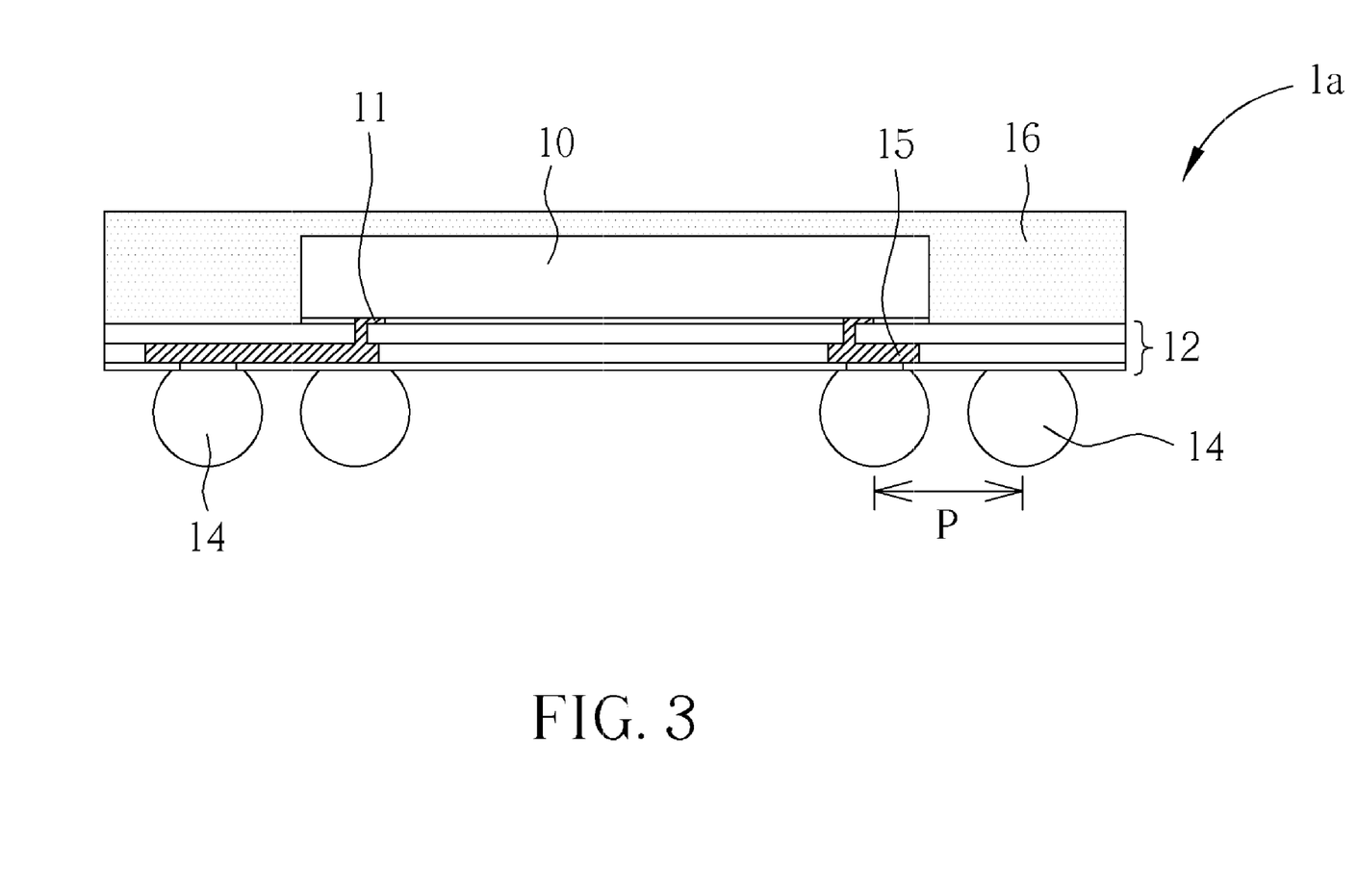
FIG. 3 is a schematic, cross-sectional diagram showing a fan-out wafer level package (WLP) according to this invention.

FIG. 3 is a schematic, cross-sectional diagram showing a fan-out wafer level package (WLP) according to one embodiment of this invention. As shown in FIG. 3, the fan-out WLP 1a comprises a semiconductor die 10 and a mold cap 16 encapsulates a portion of the semiconductor die 10, for example, the whole surface of the semiconductor die 10 is encapsulated except for the die face where the contact pads 11 are formed. A rewiring laminate structure 12 is provided directly on the die face and on a partial surface of the mold cap 16.

The re-routed metal layer in the rewiring laminate structure 12 redistributes the contact pads 11 on the die face of the semiconductor die 10 to form fan-out bond pads 15 on the insulating layer. Thereafter, the solder balls 14 are attached to the fan-out bond pads 15. If the fan-out WLP of FIG. 3 is directly mounted onto a printed circuit board (PCB) using a flip-chip technique, in one example, a ball pitch (P) of 0.5 mm is typically required for the FCCSP, which limits the maximum solder ball number of the fan-out WLP to 300 or less.

Figure 4:
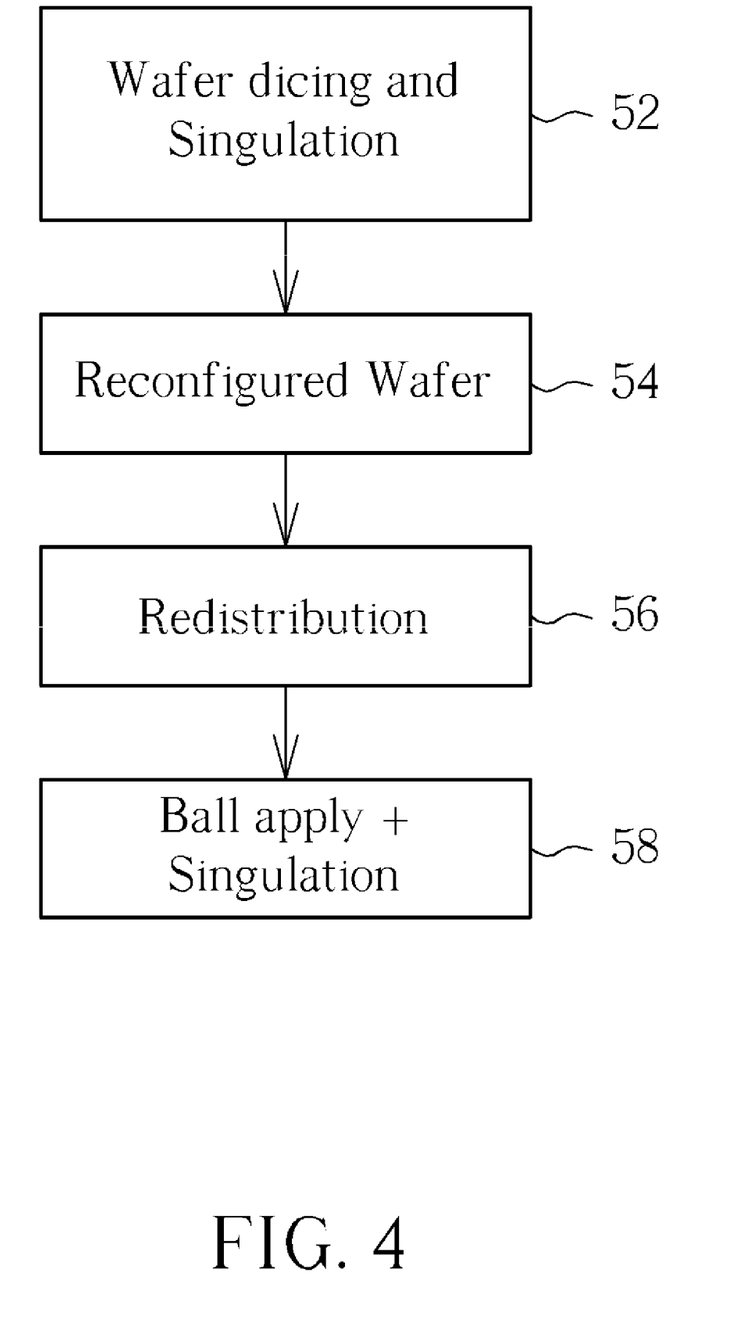
FIG. 4 is a flow chart of the steps for manufacturing the fan-out WLP of FIG. 3.

The exemplary steps for manufacturing the fan-out WLP of FIG. 3 are shown in FIG. 4. The fan-out WLP can be manufactured by several stages including wafer dicing and singulation (Step 52), wafer reconfiguration (Step 54), redistribution (Step 56), and ball implantation and package singulation (Step 58). It is understood that the fan-out WLP can be manufactured by other methods. Different companies using redistribution technique implement the fan-out WLP using different materials and processes. Nonetheless, the steps required are somewhat similar.

Redistribution layer and bump technique extends the conventional wafer fabrication process with an additional step that deposits a multi-layer thin-film metal rerouting and interconnection system to each device, e.g. chip, on the wafer. This is achieved using the similar and compatible photolithography and thin film deposition techniques employed in the device fabrication itself. This additional level of interconnection redistributes the peripheral contact pads of each chip to an area array of underbump metal (UBM) pads that are evenly deployed over the chip's surface. The solder balls or bumps used in connecting the chip to the application circuit board are subsequently placed over these UBM pads, e.g. the fan-out bond pads 15.

For example, the first layer put over the wafer to package the device is usually a benzocyclobutane (BCB)-based polymer dielectric, to isolate the device circuitry from the rewiring system, e.g. rewiring laminate structure. A rewiring metallization layer, usually Cu, Al, or a specially-developed alloy, is then deposited over this dielectric. This rewiring metallization layer is then covered by another BCB dielectric layer serving as the solder mask. Underbump metallization is then put over the positions to be subsequently occupied by the solder balls. After the balls have been attached, flip-chip techniques are used to mount the fan-out WLP onto the circuit board.

Figure 5:
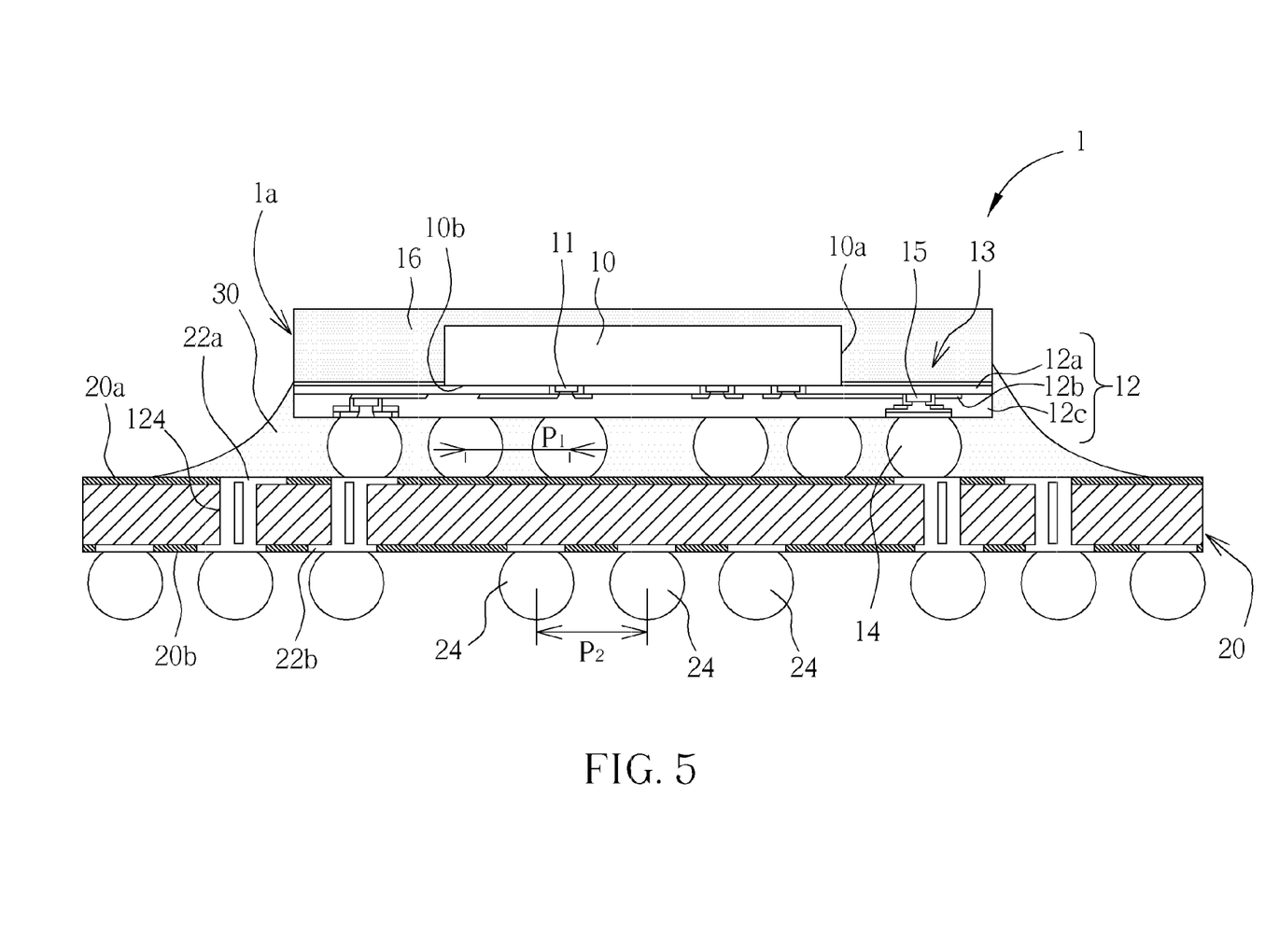
FIG. 5 is a schematic, cross-sectional diagram illustrating a flip-chip package in accordance with one embodiment of this invention.

FIG. 5 is a schematic, cross-sectional diagram illustrating a flip-chip package in accordance with one embodiment of this invention. As shown in FIG. 5, the flip-chip package 1 includes a flipped semiconductor die 10 that is assembled face-down to a chip side 20a of a package carrier 20. For example, the package carrier 20 is a package substrate with two metal wiring layers 22a and 22b disposed on the chip side 20a and on an opposite side 20b respectively. The metal wiring layers 22a and 22b are electrically interconnected to each other by means of plated through holes 124 that are formed in the package carrier 20 by mechanical drilling methods according to this embodiment. Further, it is understood that the package carrier 20 may have multiple metal wiring layers, for example, four layers or six layers. In another embodiment, the package carrier 20 may be a leadframe.

It is advantageous to use this embodiment because by applying the mechanical drilled package carrier 20 the cost of the chip package is greatly reduced (compared to the laser drilled package carrier, e.g. the chip carrier substrate 220 in FIG. 2). In addition, the original fan-out WLP as illustrated in FIG. 3 has its limit to the number of the I/O pin count, typically less than 300. This embodiment is able to overcome this limit.

The semiconductor die 10 is a redistributed high-pin-count chip, for example, with an I/O pin count that exceeds 300. By way of example, the flip-chip package 1 is particularly suited for chips with at least 500 I/O pin count. Typically, for such high-pin-count applications, it is known that incorporation of an expensive chip carrier substrate with 1+2+1 build up or a costly silicon interposer is inevitable. This embodiment of the present invention can enable the elimination of such expensive chip carrier substrate with 1+2+1 build up or a costly silicon interposer.

It is one germane feature of this embodiment that at least one rewiring laminate structure 12 is provided directly on the die face of the semiconductor die 10, and a mold cap 16 encapsulates a portion of the semiconductor die 10, e.g. the whole surface except for the die face where the contact pads 11 are formed. According to the embodiment of this invention, the rewiring laminate structure 12 comprises an insulating layer 12a, a re-routed metal layer 12b and a solder resist layer 12c. At least a portion of the re-routed metal layer 12b as specifically indicated by numeral number 13 projects beyond the die edge 10a. That is, the re-routed metal layer 12b laterally extends over a surface of the mold cap 16 that is substantially coplanar with the die face 10b where the contact pads 11 are formed.

The re-routed metal layer 12b redistributes the contact pads 11 on the die face of the semiconductor die 10 to form fan-out bond pads 15 on the insulating layer 12a, thereby overcoming the bump pitch limitation on the substrate. It is noteworthy that there may be different types and choices of the fan-out bond pads 15, which should not limit the scope of the invention. The term "on the insulating layer 12a" herein means that the fan-out bond pads 15 is disposed on a surface of the insulating layer 12a and, for example, is formed after the insulating layer 12a is deposited.

The embodiment of the invention is capable of overcoming another bump pitch limitation caused by small die size because the rewiring laminate structure 12 is formed during the wafer processing and fabrication and thus a more flexible pitch rule is provided by the rewiring laminate structure 12. Accordingly, the maximum pad number can be increased due to the fan-out structure of the rewiring laminate structure 12.

The semiconductor die 10 is electrically connected to the package carrier 20 through the re-routed metal layer 12b and the solder bumps 14 disposed on the fan-out bond pad 15 defined in the rewiring laminate structure 12. The solder bumps 14 may comprise eutectic (e.g. 63% Sn, 37% Pb) or high lead (e.g. 95% Pb, 5% Sn) or lead-free (e.g. 97.5% Sn, 2.5% Ag) compositions. According to the embodiments of this invention, the bump pitch $P_1$ of the solder bumps 14 is about 0.15-0.3 mm. On the opposite side 20b, a plurality of solder balls 24 are provided with a ball pitch $P_2$ of about 0.5 mm, for example, with the PCB utilized in FCCSP.

There are many known processes for flip-chip bumping. Solder bumping may, for example, put underbump metallization (UBM) over the bond pad by sputtering, plating, or a similar means. This process of putting UBM removes the passivating oxide layer on the bond pad and defines the solder-wetted area. Solder may then be deposited over the UBM by a suitable method, e.g., evaporation, electroplating, screen-printing, or needle-depositing, etc.

The solder bumped die 10 is attached to the package carrier 20 by a solder reflow process. Thereafter, an underfill 30 is then added between the rewiring laminate structure 12 and the package carrier 20. The underfill 30 may be a specially engineered epoxy that fills the gap between the rewiring laminate structure 12 and the package carrier 20, surrounding the solder bumps 14. It is designed to control the stress in the solder joints caused by the difference in thermal expansion between the semiconductor die 10 and the package carrier 20. Once cured, the underfill 30 absorbs the stress, reducing the strain on the solder bumps 14, greatly increasing the life of the finished package.

In one aspect, a semiconductor chip package (e.g. the flip-chip package 1) comprises a semiconductor die 10 having thereon a plurality of contact pads 11 on its die face, a mold cap 16 encapsulating a portion of the semiconductor die 10e, and a redistribution layer (e.g. the rewiring laminate structure 12) covering the die face and a portion of the mold cap 16 for redistributing. The redistribution layer fans out the contact pads 11. A plurality of bumps 14 is disposed on the redistribution layer. The semiconductor chip package further comprises a substrate (e.g. the package carrier 20) with two metal wiring layers 22a and 22b disposed on a chip side 20a and on an opposite side 20b respectively. The plurality of bumps 14 are mounted on the chip side 20a. Solder balls 24 are disposed on the opposite side 20b of the substrate 20.

In another aspect, a semiconductor chip package (e.g. the flip-chip package 1) includes a package carrier 20 with two metal wiring layers 22a and 22b disposed on a chip side 20a and on an opposite side 20b of the package carrier 20 respectively. A fan-out wafer level device (e.g. the fan-out WLP 1a) is mounted on the chip side 20a of the package carrier 20. An underfill 30 is applied between the package carrier 20 and the fan-out wafer level device.

The embodiments of the present invention uses a cost-competitive two-layer, mechanically drilled substrate e.g. the package carrier 20, instead of expensive approaches, such as using the costly silicon interposer, for high-pin-count chips in order to achieve cost down on flip-chip package solution. The embodiments feature the rewiring laminate structure 12 provided directly on the die face. The re-routed metal layer 12b of the rewiring laminate structure 12 redistributes the contact pads 11 on the die face and forms the fan-out bond pads 15, thereby overcoming the bump pitch limitation on the substrate in the WLP.

Figure 6:
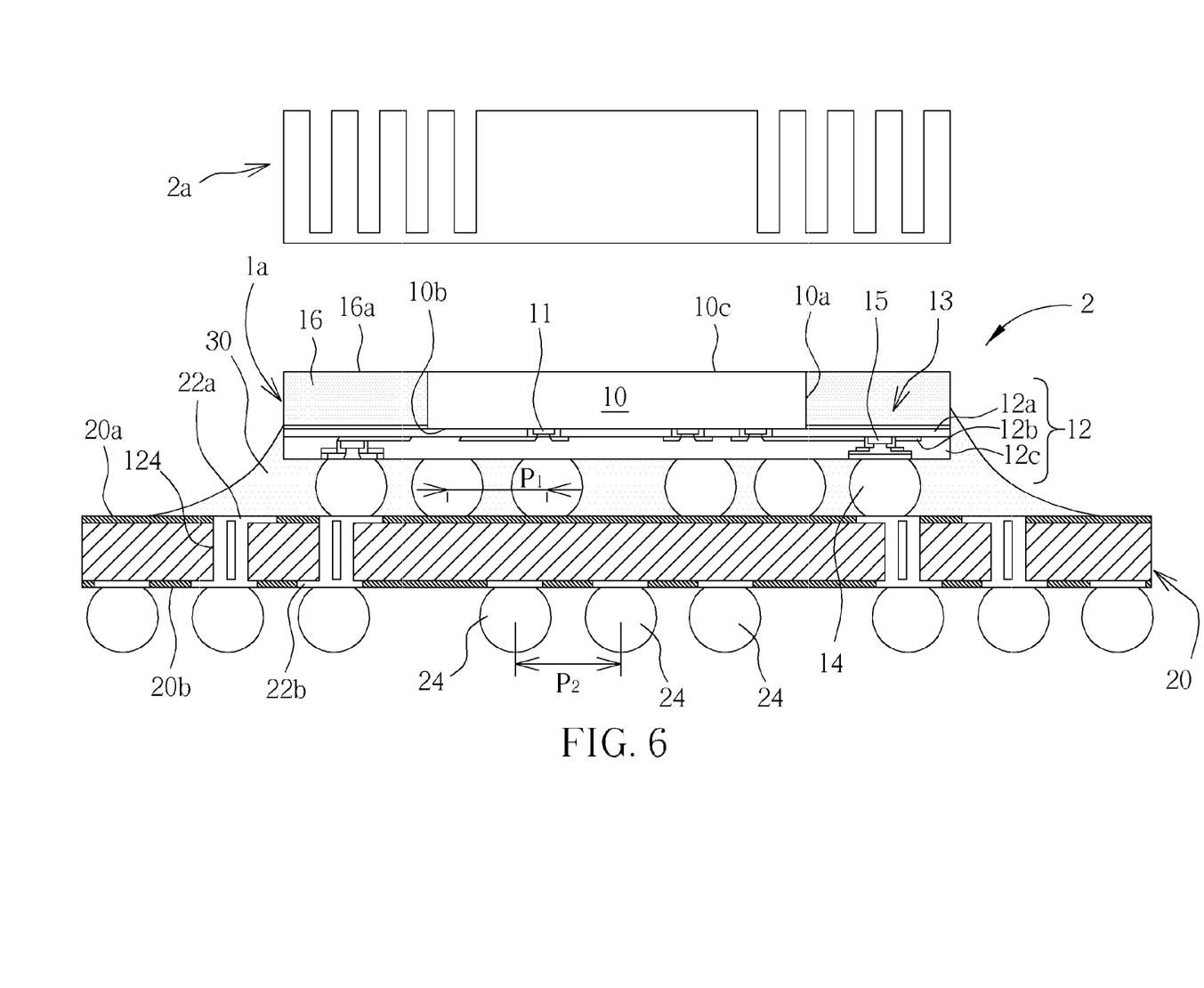
FIG. 6 is a schematic, cross-sectional diagram illustrating a flip-chip package in accordance with another embodiment of this invention.

FIG. 6 is a schematic, cross-sectional diagram illustrating a flip-chip package in accordance with another embodiment of this invention, wherein like numeral numbers designate like layers, elements or regions. As shown in FIG. 6, the flip-chip package 2 has a structure that is pretty much the same as the flip-chip package 1 set forth in FIG. 5 except that a bottom surface 10c opposite to the die face 10b is exposed by removing a portion of the mold cap 16 such that the top surface 16a of the mold cap 16 is flush with the bottom surface 10c. An external heatsink 2a can be mounted to the exposed bottom surface 10c of the semiconductor die 10. By doing this, the heat dissipating efficiency is improved. Of course, the external heatsink 2a of such type shown in FIG. 6 is only provided for illustration, not limiting the alternatives or modifications of this embodiment. That is, other types of heatsinks, which is able to be properly amounted to the exposed bottom surface 10c, should be implemented in this embodiment as well.

Figure 7:
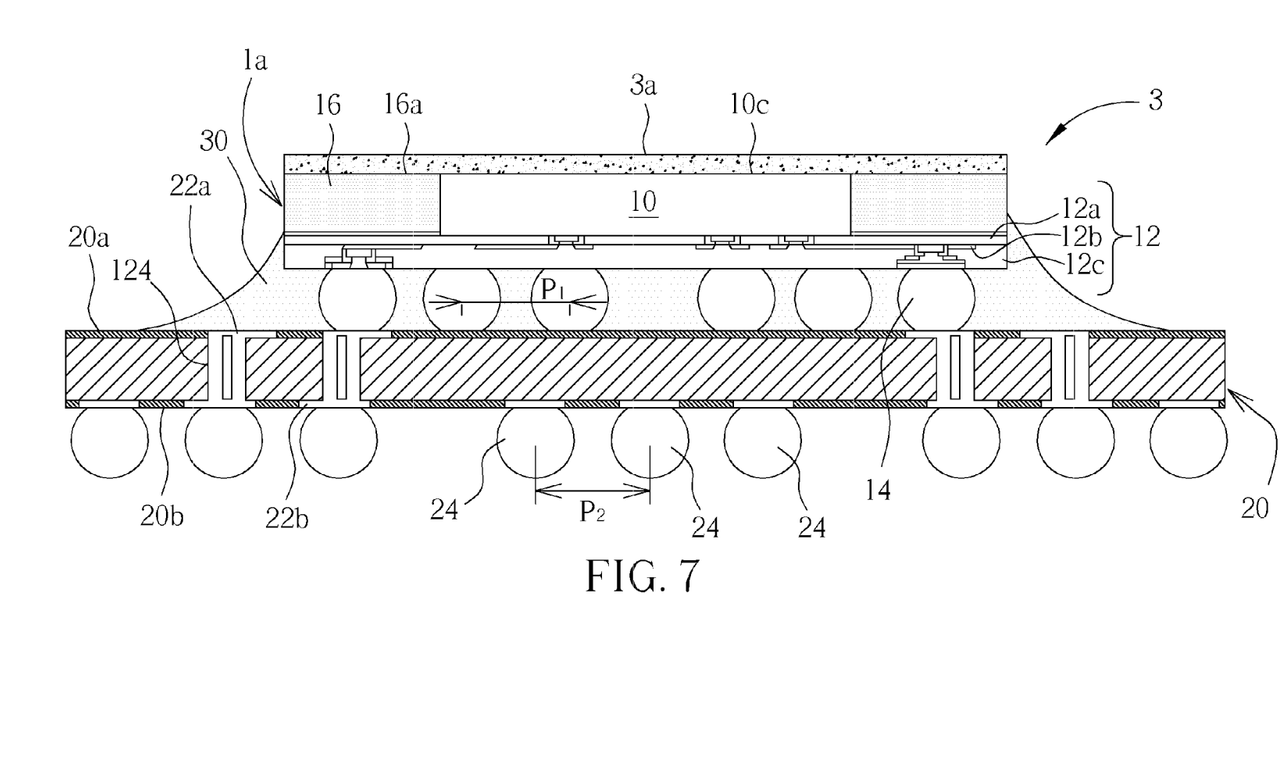
FIG. 7 is a schematic, cross-sectional diagram illustrating a flip-chip package in accordance with yet another embodiment of this invention.

FIG. 7 is a schematic, cross-sectional diagram illustrating a flip-chip package in accordance with yet another embodiment of this invention, wherein like numeral numbers designate like layers, elements or regions. As shown in FIG. 7, likewise, the flip-chip package 3 has a structure that is analogous to the flip-chip package 1 set forth in FIG. 5 except for an exposed bottom surface 10c opposite to the die face 10b. The bottom surface 10c is exposed by removing an upper portion of the mold cap 16 such that the top surface 16a of the mold cap 16 is substantially flush with the bottom surface 10c. The flip-chip package 3 further comprises a heat-spreading layer 3a mounted to the exposed bottom surface 10c and the top surface 16a of the mold cap 16 of the semiconductor die 10.

Figure 8:
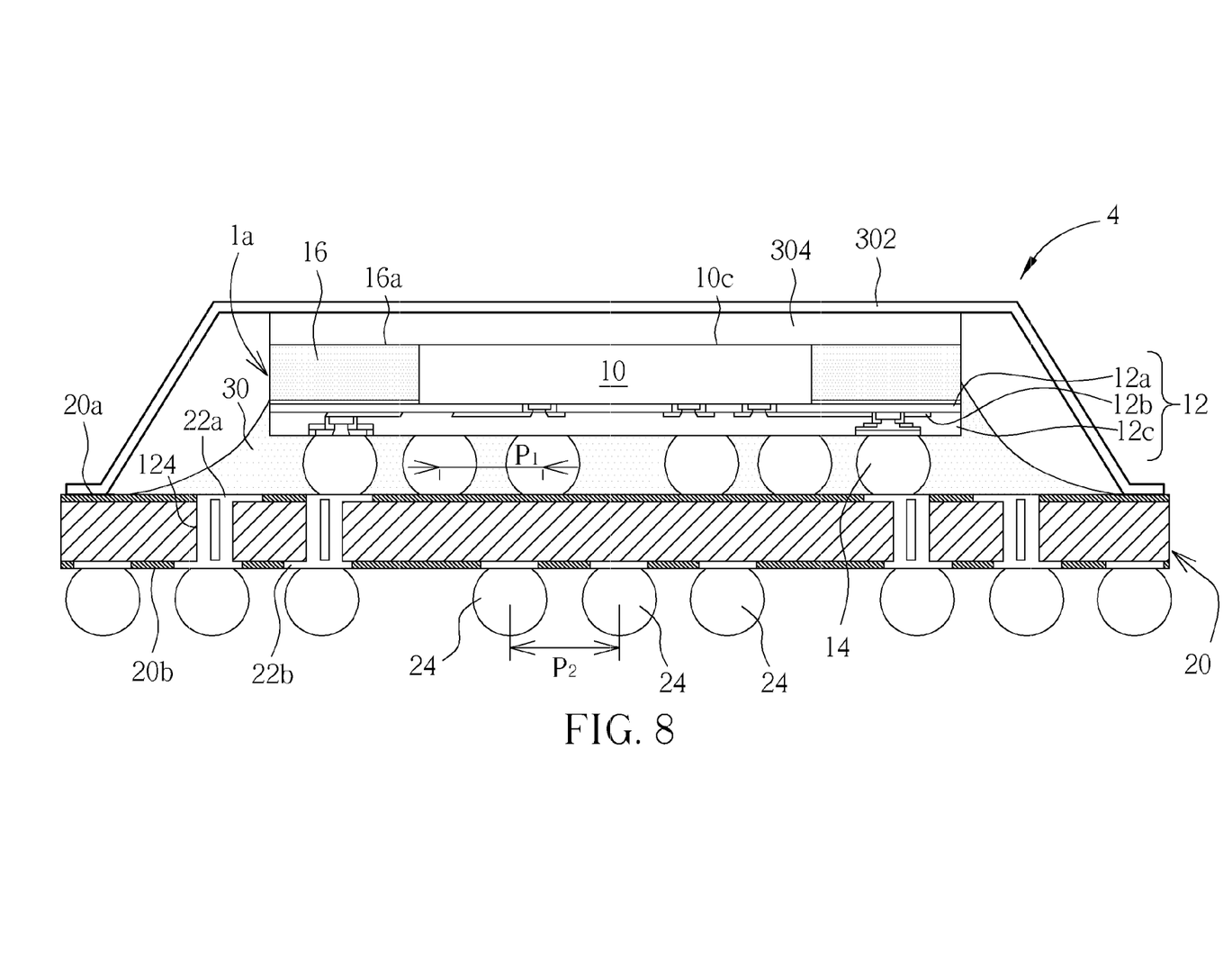
FIG. 8 is a schematic, cross-sectional diagram illustrating a flip-chip package in accordance with yet another embodiment of this invention.

FIG. 8 is a schematic, cross-sectional diagram illustrating a flip-chip package in accordance with yet another embodiment of this invention, wherein like numeral numbers designate like layers, elements or regions. As shown in FIG. 8, the flip-chip package 4 is analogous to the flip-chip package 1 set forth in FIG. 5 except for an exposed bottom surface 10c opposite to the die face 10b. The bottom surface 10c is exposed by removing or cutting off an upper portion of the mold cap 16 such that the top surface 16a of the mold cap 16 is substantially flush with the bottom surface 10c. A heat-spreading lid 302 is mounted on exposed bottom surface 10c. A layer of thermal glue 304 may be applied on the exposed bottom surface 10c before assembling the heat-spreading lid 302. In another embodiment, the heat-spreading lid 302 may be directly in contact with the exposed bottom surface 10c.

Figure 9:
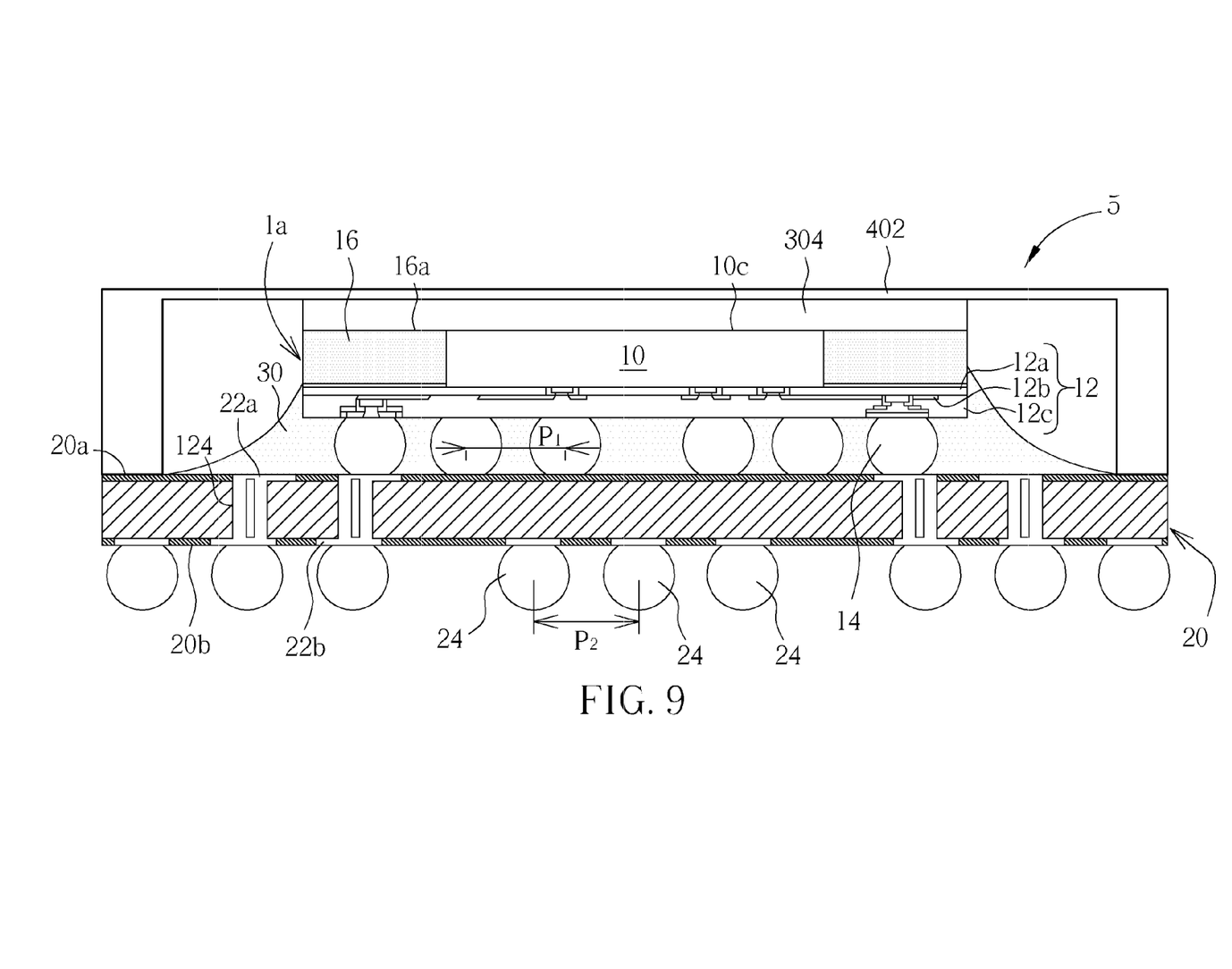
FIG. 9 is a schematic, cross-sectional diagram illustrating a flip-chip package in accordance with yet another embodiment of this invention.

FIG. 9 is a schematic, cross-sectional diagram illustrating a flip-chip package in accordance with yet another embodiment of this invention, wherein like numeral numbers designate like layers, elements or regions. As shown in FIG. 9, the flip-chip package 5 is analogous to the flip-chip package 1 set forth in FIG. 5 except for an exposed bottom surface 10c opposite to the die face 10b. The bottom surface 10c is exposed by removing or cutting off an upper portion of the mold cap 16 such that the top surface 16a of the mold cap 16 is substantially flush with the bottom surface 10c. The flip-chip package 5 includes a one-piece, monolithic heat spreader 402 that caps the semiconductor die 10. Likewise, a layer of thermal glue 304 may be applied on the exposed bottom surface 10c before assembling the heat spreader 402. In another embodiment, the heat spreader 402 may be directly in contact with the exposed bottom surface 10c.

Figure 10:
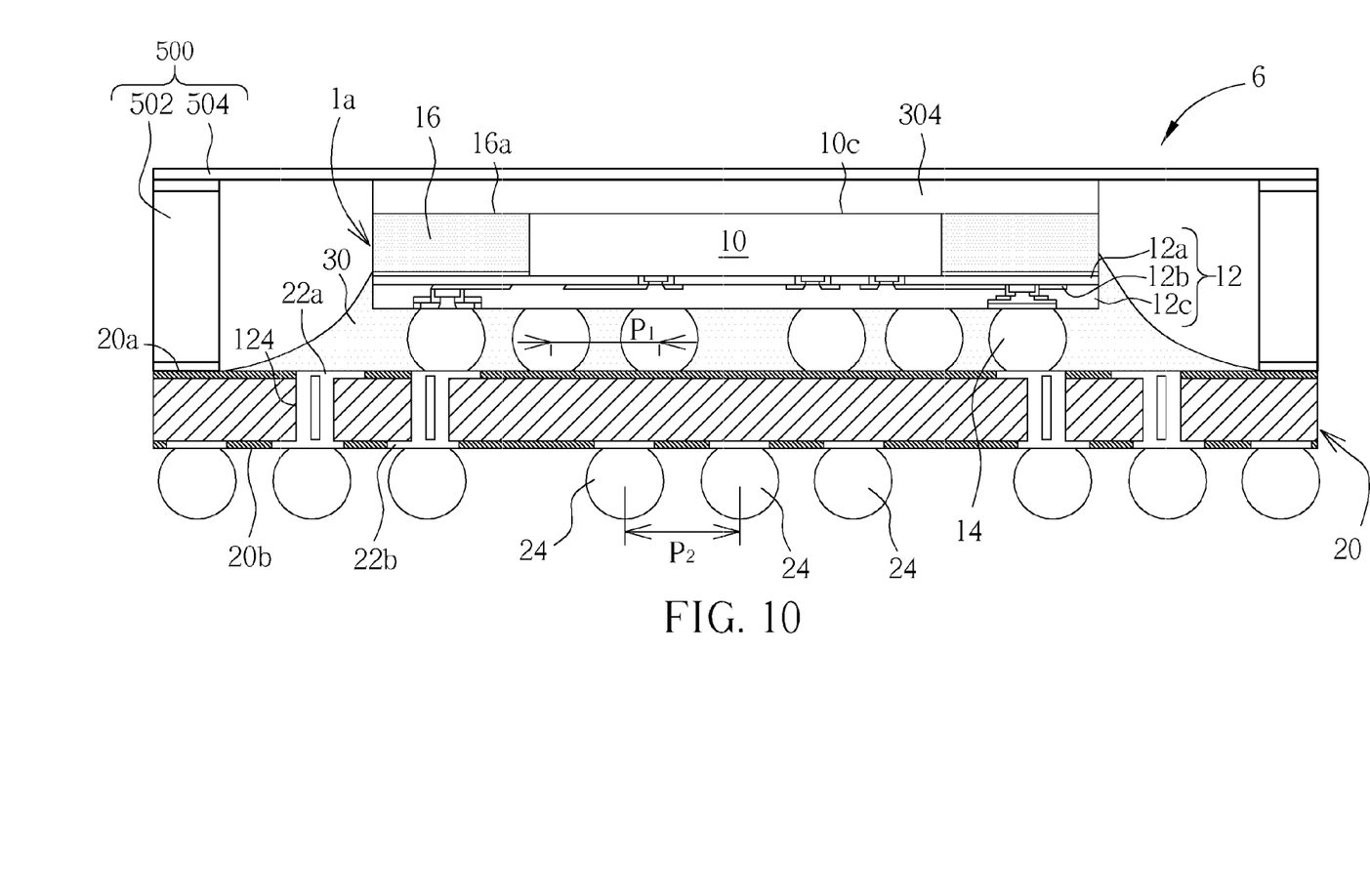
FIG. 10 is a schematic, cross-sectional diagram illustrating a flip-chip package in accordance with yet another embodiment of this invention.

FIG. 10 is a schematic, cross-sectional diagram illustrating a flip-chip package in accordance with yet another embodiment of this invention, wherein like numeral numbers designate like layers, elements or regions. As shown in FIG. 10, the flip-chip package 6 is analogous to the flip-chip package 1 set forth in FIG. 5 except for an exposed bottom surface 10c opposite to the die face 10b. The bottom surface 10c is exposed by removing or cutting off an upper portion of the mold cap 16 such that the top surface 16a of the mold cap 16 is substantially flush with the bottom surface 10c. The flip-chip package 6 comprises a two-piece heat spreader 500 including a frame 502 and a lid 504 that caps the semiconductor die 10. Likewise, a layer of thermal glue 304 may be applied on the exposed bottom surface 10c. In another embodiment, the lid 504 may be directly in contact with the exposed bottom surface 10c.

Figure 11:
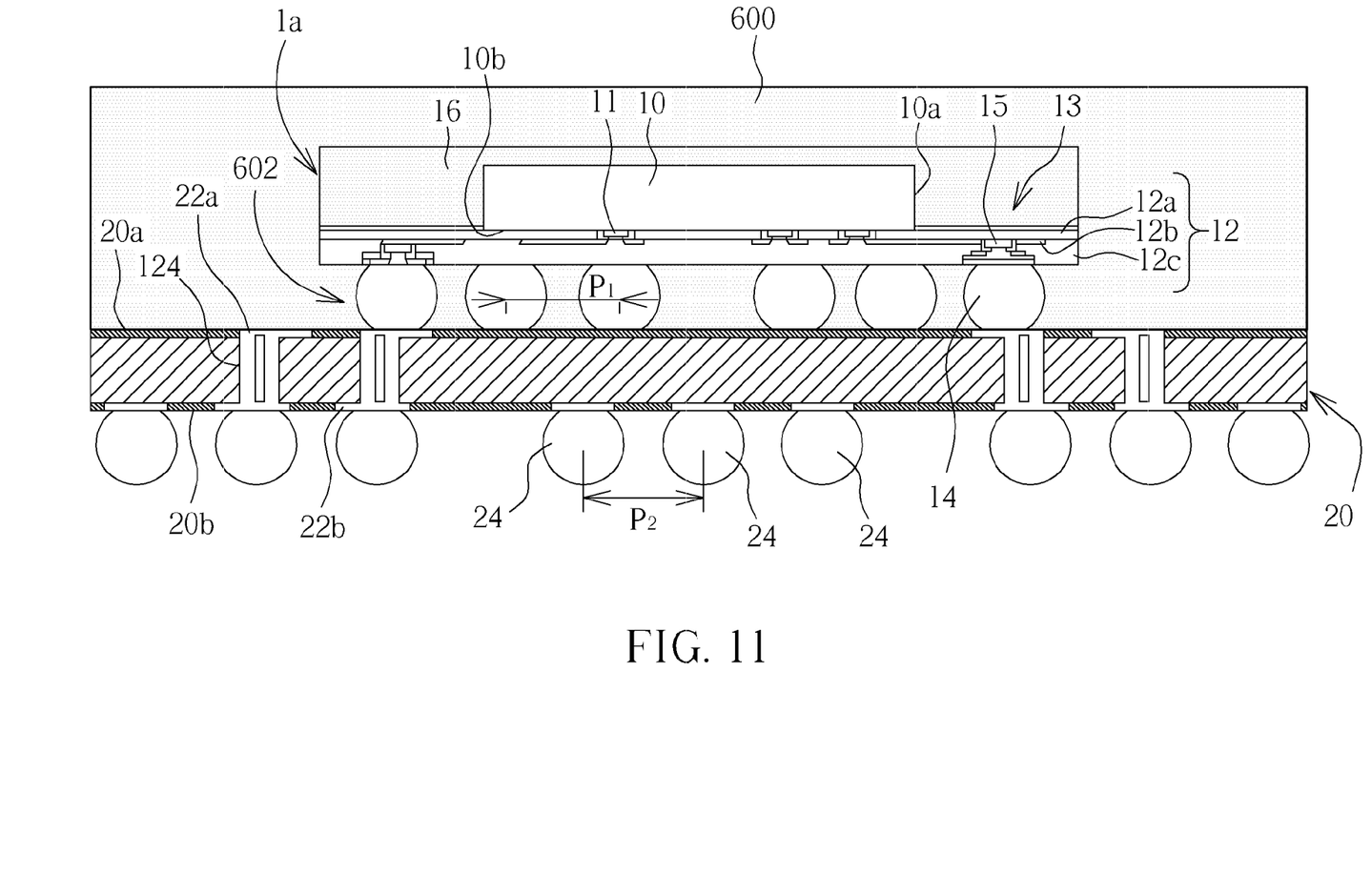
FIG. 11 is a schematic, cross-sectional diagram illustrating a flip-chip package in accordance with yet another embodiment of this invention.

FIG. 11 is a schematic, cross-sectional diagram illustrating a flip-chip package in accordance with yet another embodiment of this invention, wherein like numeral numbers designate like layers, elements or regions. As shown in FIG. 11, as the bump pitch $P_1$ of the solder bumps 14 is enlarged, in some cases, the underfill may be spared. Instead, a molding compound 600 encapsulates the fan-out WLP 1a and fills into the gap 602 between the rewiring laminate structure 12 and the chip side 20a of the package carrier 20, thereby forming a mold-only flip-chip chip-scale package (FCCSP).

Figure 12:
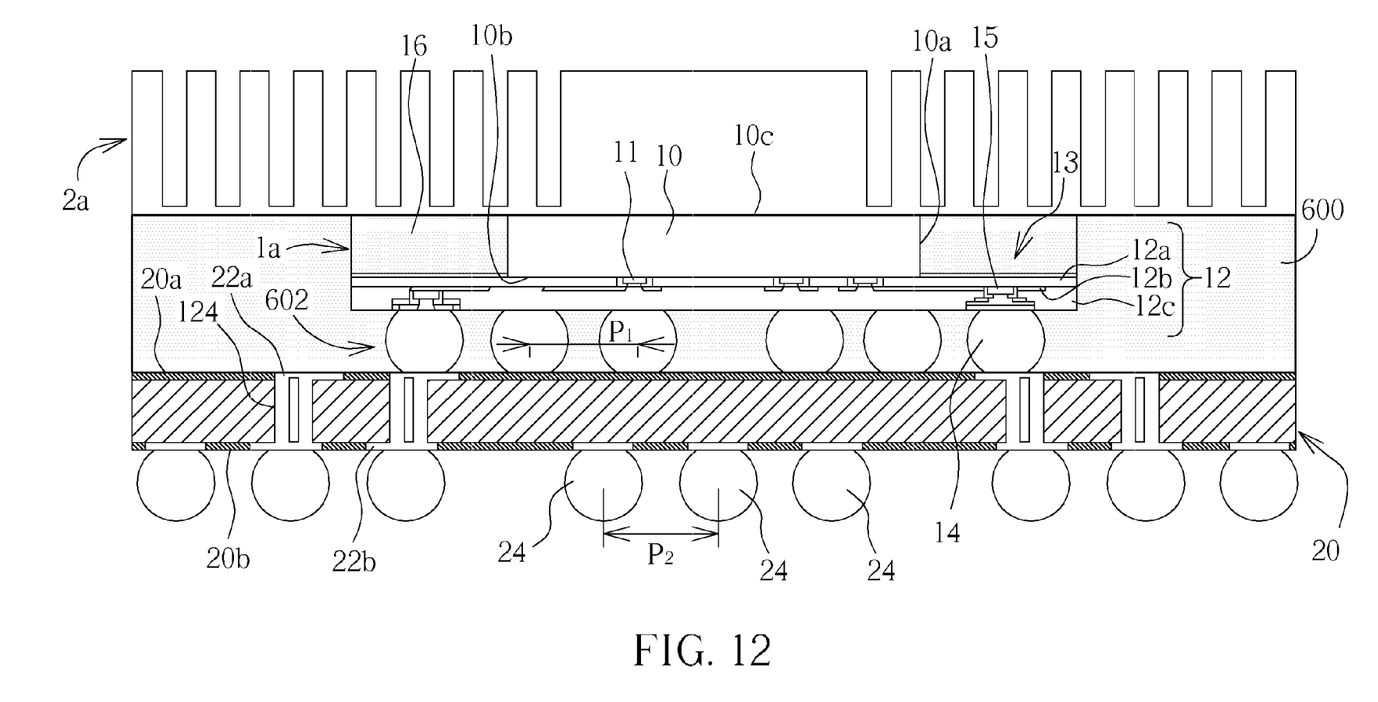
FIG. 12 is a schematic, cross-sectional diagram illustrating a flip-chip package in accordance with yet another embodiment of this invention.

FIG. 12 is a schematic, cross-sectional diagram illustrating a flip-chip package in accordance with yet another embodiment of this invention, wherein like numeral numbers designate like layers, elements or regions. As shown in FIG. 12, an upper portion of the molding compound 600 and an upper portion of the mold cap 16 are removed or cut off in order to expose the bottom surface 10c opposite to the die face 10b. The top surface 16a of the mold cap 16 is substantially flush with the bottom surface 10c. A heat sink 2a is mounted on the bottom surface 10c.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flip-chip package, comprising:
   a package carrier;
   a semiconductor die having a die face and a die edge, the semiconductor die being assembled face-down to a chip side of the package carrier, wherein a plurality of contact pads are situated on the die face;
   a rewiring laminate structure between the semiconductor die and the package carrier, the rewiring laminate structure comprising a re-routed metal layer, wherein at least a portion of the re-routed metal layer projects beyond the die edge;
   an underfill between the rewiring laminate structure and the package carrier; and
   a plurality of bumps arranged on the rewiring laminate structure for electrically connecting the semiconductor die with the package carrier.

2. The flip-chip package according to claim 1 wherein the package carrier is a substrate comprising two metal wiring layers disposed on the chip side and on an opposite side of the package carrier respectively.

3. The flip-chip package according to claim 2 wherein the two metal wiring layers are electrically interconnected to each other by means of plated through holes that are formed in the package carrier by mechanical drilling methods.

4. The flip-chip package according to claim 1 wherein the re-routed metal layer redistributes the contact pads on the die face of the semiconductor die to form fan-out bond pads, and the plurality of bumps are arranged on the fan-out bond pads respectively.

5. A flip-chip package, comprising:
   a package carrier;
   a semiconductor die having a die face and a die edge, the semiconductor die being assembled face-down to a chip side of the package carrier, wherein a plurality of contact pads are situated on the die face;
   a mold cap encapsulating a portion of the semiconductor die;
   a rewiring laminate structure between the semiconductor die and the package carrier, the rewiring laminate structure comprising a re-routed metal layer, wherein at least a portion of the re-routed metal layer projects beyond the die edge; and a plurality of bumps arranged on the rewiring laminate structure for electrically connecting the semiconductor die with the package carrier.

6. A flip-chip package, comprising:

a leadframe;

a semiconductor die having a die face and a die edge, the semiconductor die being assembled face-down to a chip side of the leadframe, wherein a plurality of contact pads are situated on the die face;

a rewiring laminate structure between the semiconductor die and the leadframe, the rewiring laminate structure comprising a re-routed metal layer, wherein at least a portion of the re-routed metal layer projects beyond the die edge; and a plurality of bumps arranged on the rewiring laminate structure for electrically connecting the semiconductor die with the leadframe.

7. The flip-chip package according to claim 1 wherein the plurality of bumps arranged on the rewiring laminate structure have a bump pitch of about 0.15-0.3 mm.

8. A semiconductor chip package, comprising:

a semiconductor die having thereon a plurality of contact pads on its die face;

a mold cap encapsulating a portion of the semiconductor die;

a redistribution layer covering the die face and a portion of the mold cap for redistributing, wherein the redistribution layer fans out the contact pads;

a plurality of bumps on the redistribution layer;

a substrate comprising two metal wiring layers disposed on a chip side and on an opposite side respectively, wherein the plurality of bumps are mounted on the chip side; and a plurality of solder balls on the opposite side of the substrate.

9. The semiconductor chip package according to claim 8 wherein the two metal wiring layers are electrically interconnected to each other by means of plated through holes that are formed by mechanical drilling methods.

10. The semiconductor chip package according to claim 8 further comprising an underfill between the redistribution layer and the substrate.

11. The semiconductor chip package according to claim 8 wherein the plurality of bumps on the redistribution layer have a bump pitch of about 0.15-0.3 mm, and the plurality of solder balls on the opposite side of the substrate have a ball pitch of about 0.5 mm.

12. A semiconductor chip package, comprising:

a semiconductor die having thereon a plurality of contact pads on its die face;

a mold cap encapsulating a portion of the semiconductor die;

a redistribution layer covering the die face and a portion of the mold cap for redistributing, wherein the redistribution layer fans out the contact pads;

a plurality of bumps on the redistribution layer; and a leadframe, wherein the semiconductor die is mounted on the leadframe.

13. A semiconductor chip package, comprising:

a package carrier having a chip side and an opposite side;

a fan-out wafer level device mounted on the chip side of the package carrier; and an underfill between the package carrier and the fan-out wafer level device.

14. The semiconductor chip package according to claim 13 wherein fan-out wafer level device comprises:

a semiconductor die;

a mold cap encapsulating a portion of the semiconductor die; and a redistribution layer for fan out contact pads of the semiconductor die.

15. The semiconductor chip package according to claim 14 wherein fan-out wafer level device further comprises a plurality of bumps disposed on the redistribution layer, the plurality of bumps have a bump pitch of about 0.15-0.3 mm.

16. The semiconductor chip package according to claim 13 wherein the package carrier is a substrate comprising two metal wiring layers disposed on the chip side and on an opposite side of the package carrier respectively, or is a leadframe.

17. A semiconductor chip package, comprising:

a package carrier having a chip side and an opposite side;

a fan-out wafer level device mounted on the chip side of the package carrier; and a molding compound encapsulating the fan-out wafer level device and the molding compound also filling into a gap between the package carrier and the fan-out wafer level device.

18. The semiconductor chip package according to claim 17 wherein fan-out wafer level device comprises:

a semiconductor die;

a mold cap encapsulating a portion of the semiconductor die; and a redistribution layer for fan out contact pads of the semiconductor die.

19. The semiconductor chip package according to claim 18 wherein fan-out wafer level device further comprises a plurality of bumps disposed on the redistribution layer, and the plurality of bumps have a bump pitch of about 0.15-0.3 mm.

20. The semiconductor chip package according to claim 17 wherein the package carrier is a substrate comprising two metal wiring layers disposed on the chip side and on an opposite side of the package carrier respectively, or is a leadframe.

21. The flip-chip package according to claim 1 wherein the semiconductor die has an I/O pin count that exceeds 300.

22. The flip-chip package according to claim 1 wherein the rewiring laminate structure further comprises an insulating layer and a solder resist layer.

23. The flip-chip package according to claim 1 wherein a heat sink is mounted on a bottom surface of the semiconductor die that is opposite to the die face.

24. The flip-chip package according to claim 5 wherein the semiconductor die has an I/O pin count that exceeds 300.

25. The flip-chip package according to claim 5 wherein the rewiring laminate structure further comprises an insulating layer and a solder resist layer.

26. The flip-chip package according to claim 5 wherein a heat sink is mounted on a bottom surface of the semiconductor die that is opposite to the die face.

27. The flip-chip package according to claim 5 wherein the package carrier is a substrate comprising two metal wiring layers disposed on the chip side and on an opposite side of the package carrier respectively.

28. The flip-chip package according to claim 27 wherein the two metal wiring layers are electrically interconnected to each other by means of plated through holes that are formed in the package carrier by mechanical drilling methods.

29. The flip-chip package according to claim 5 wherein the re-routed metal layer redistributes the contact pads on the die face of the semiconductor die to form fan-out bond pads, and the plurality of bumps are arranged on the fan-out bond pads respectively.

30. The flip-chip package according to claim 5 wherein the plurality of bumps arranged on the rewiring laminate structure have a bump pitch of about 0.15-0.3 mm.

31. The flip-chip package according to claim 6 wherein the semiconductor die has an I/O pin count that exceeds 300.

32. The flip-chip package according to claim 6 wherein the rewiring laminate structure further comprises an insulating layer and a solder resist layer.

33. The flip-chip package according to claim 6 wherein a heat sink is mounted on a bottom surface of the semiconductor die that is opposite to the die face.

34. The flip-chip package according to claim 6 wherein the re-routed metal layer redistributes the contact pads on the die face of the semiconductor die to form fan-out bond pads, and the plurality of bumps are arranged on the fan-out bond pads respectively.

35. The flip-chip package according to claim 6 wherein the plurality of bumps arranged on the rewiring laminate structure have a bump pitch of about 0.15-0.3 mm.

36. The flip-chip package according to claim 8 wherein the semiconductor die has an I/O pin count that exceeds 300.

37. The flip-chip package according to claim 8 wherein a heat sink is mounted on a bottom surface of the semiconductor die that is opposite to the die face.

38. The flip-chip package according to claim 12 wherein the semiconductor die has an I/O pin count that exceeds 300.

39. The flip-chip package according to claim 12 wherein a heat sink is mounted on a bottom surface of the semiconductor die that is opposite to the die face.

40. The semiconductor chip package according to claim 12 further comprising an underfill between the redistribution layer and the substrate.

41. The semiconductor chip package according to claim 12 wherein the plurality of bumps on the redistribution layer have a bump pitch of about 0.15-0.3 mm, and the plurality of solder balls on the opposite side of the substrate have a ball pitch of about 0.5 mm.

42. The flip-chip package according to claim 13 wherein the semiconductor die has an I/O pin count that exceeds 300.

43. The flip-chip package according to claim 17 wherein the semiconductor die has an I/O pin count that exceeds 300.

44. The flip-chip package according to claim 18 wherein a heat sink is mounted on a bottom surface of the semiconductor die.

45. The flip-chip package according to claim 44 wherein the heat sink directly contacts with the bottom surface of the semiconductor die.

46. A flip-chip package, comprising:
a package carrier;
a semiconductor die having a die face and a die edge, the semiconductor die being assembled face-down to a chip side of the package carrier, wherein a plurality of contact pads are situated on the die face;
a rewiring laminate structure between the semiconductor die and the package carrier, the rewiring laminate structure comprising a re-routed metal layer, an insulating layer and a solder resist layer, wherein at least a portion of the re-routed metal layer projects beyond the die edge; and
a plurality of bumps arranged on the rewiring laminate structure for electrically connecting the semiconductor die with the package carrier.

47. The flip-chip package according to claim 46 wherein the package carrier is a substrate comprising two metal wiring layers disposed on the chip side and on an opposite side of the package carrier respectively.

48. The flip-chip package according to claim 47 wherein the two metal wiring layers are electrically interconnected to each other by means of plated through holes that are formed in the package carrier by mechanical drilling methods.

49. The flip-chip package according to claim 46 wherein the re-routed metal layer redistributes the contact pads on the die face of the semiconductor die to form fan-out bond pads, and the plurality of bumps are arranged on the fan-out bond pads respectively.

50. The flip-chip package according to claim 46 wherein the semiconductor die has an I/O pin count that exceeds 300.

51. The flip-chip package according to claim 46 wherein the re-routed metal layer is disposed on the insulating layer, and the solder resist layer covers the re-routed metal layer and the insulating layer.

52. The flip-chip package according to claim 46 wherein a heat sink is mounted on a bottom surface of the semiconductor die that is opposite to the die face.

* * * * *